United States Patent
Kallingal et al.

(10) Patent No.: US 8,921,016 B1
(45) Date of Patent: Dec. 30, 2014

(54) METHODS INVOLVING COLOR-AWARE RETARGETING OF INDIVIDUAL DECOMPOSED PATTERNS WHEN DESIGNING MASKS TO BE USED IN MULTIPLE PATTERNING PROCESSES

(71) Applicant: GLOBALFOUNDRIES Inc., Grand Cayman (KY)

(72) Inventors: Chidambaram G. Kallingal, Poughkeepsie, NY (US); YuYang Sun, Wappingers Falls, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 4 days.

(21) Appl. No.: 13/936,680

(22) Filed: Jul. 8, 2013

(51) Int. Cl.
  *G03F 1/70* (2012.01)
(52) U.S. Cl.
  CPC .......................................... *G03F 1/70* (2013.01)
  USPC ...................... 430/5; 430/30; 716/50; 716/54
(58) Field of Classification Search
  CPC ........................................................ G03F 1/70
  USPC ..................................... 430/5, 30; 716/50, 54
  See application file for complete search history.

(56) References Cited

U.S. PATENT DOCUMENTS

| 8,280,191 | B1 | 10/2012 | Avidan et al. |
| 8,392,871 | B2 | 3/2013 | Mansfield et al. |
| 8,401,278 | B2 | 3/2013 | Utsugi et al. |
| 2011/0305397 | A1 | 12/2011 | Piramuthu et al. |
| 2012/0121204 | A1 | 5/2012 | Ding et al. |
| 2012/0260223 | A1 | 10/2012 | Agarwal |
| 2012/0290908 | A1 | 11/2012 | Kumar et al. |

*Primary Examiner* — Christopher Young
(74) *Attorney, Agent, or Firm* — Amerson Law Firm, PLLC

(57) ABSTRACT

One illustrative method disclosed herein includes the steps of decomposing an initial overall target exposure pattern into at least a first decomposed sub-target pattern and a second decomposed sub-target pattern, performing first and second retargeting processes on the first and second decomposed sub-target patterns while using the other sub-target pattern as a reference layer, respectively, to thereby define retargeted first and second decomposed sub-target patterns, respectively, and, after performing the first and second retargeting processes, performing at least one process operation to determine if each of the retargeted first decomposed sub-target pattern and the retargeted second decomposed sub-target pattern is in compliance with at least one design rule.

14 Claims, 5 Drawing Sheets

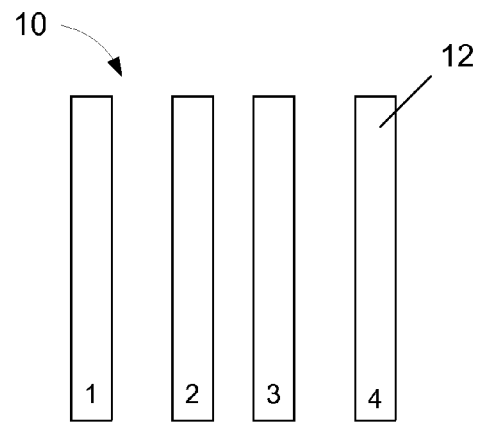
Fig. 1A (Prior Art)
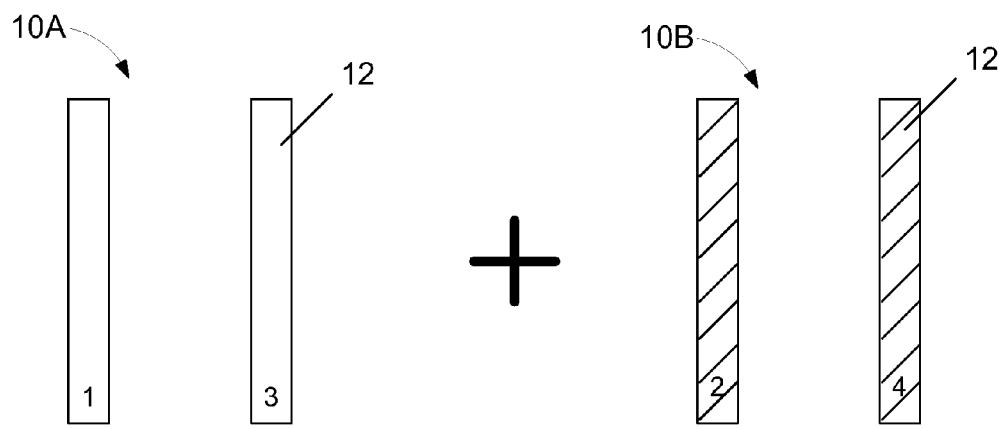
Fig. 1B (Prior Art)
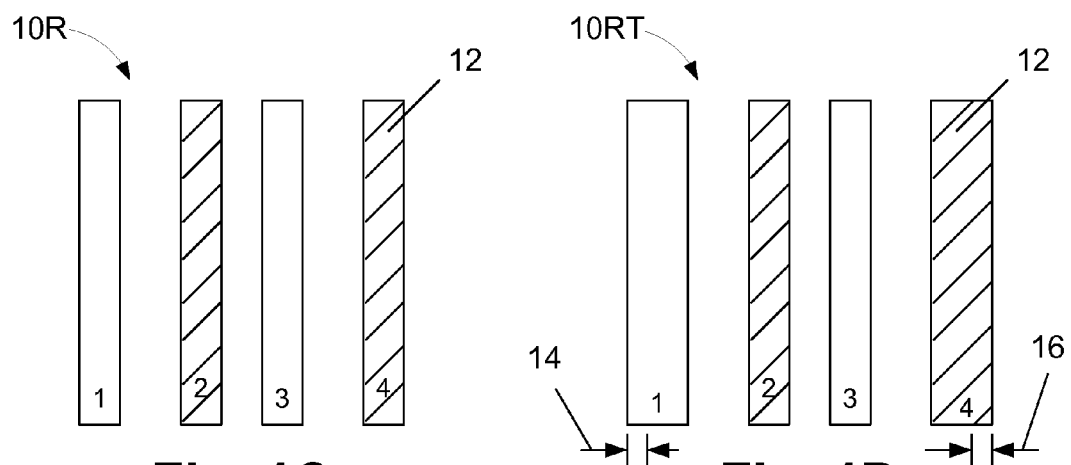
Fig. 1C (Prior Art)
Fig. 1D (Prior Art)

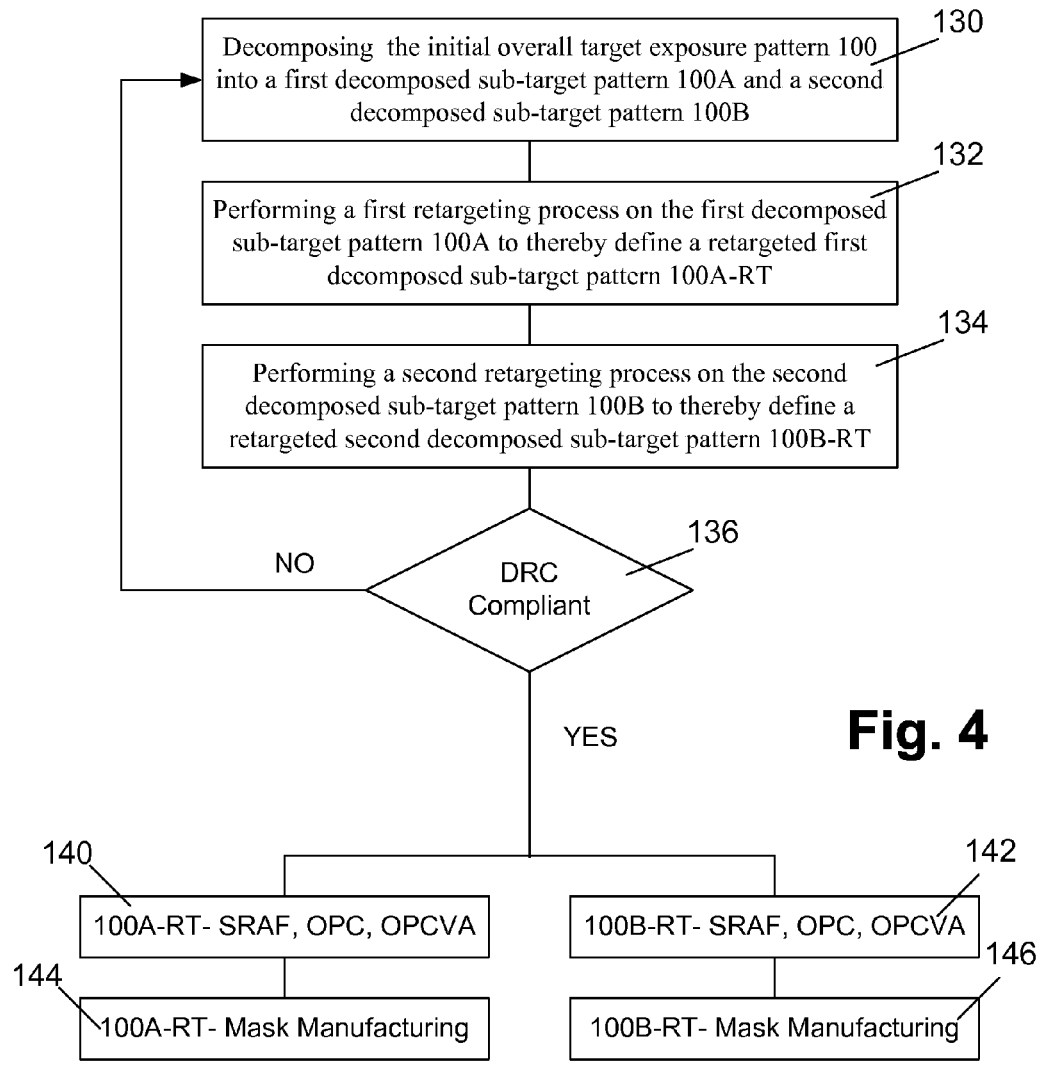

METHODS INVOLVING COLOR-AWARE RETARGETING OF INDIVIDUAL DECOMPOSED PATTERNS WHEN DESIGNING MASKS TO BE USED IN MULTIPLE PATTERNING PROCESSES

BACKGROUND OF THE INVENTION

1. Field of the Invention

Generally, the present disclosure relates to the manufacture of semiconductor devices, and, more specifically, to various methods that involve color-aware retargeting of individual decomposed patterns when designing masks or reticles to be used in multiple patterning processes, such as double patterning processes, and the use of such masks or reticles in various photolithography systems to manufacture integrated circuit products.

2. Description of the Related Art

Photolithography is one of the basic processes used in manufacturing integrated circuit products. At a very high level, photolithography involves (1) forming a layer of light or radiation-sensitive material, such as photoresist, above a layer of material or a substrate, (2) selectively exposing the radiation-sensitive material to a light generated by a light source (such as a DUV or EUV source) to transfer a pattern defined by a mask or reticle (inter-changeable terms) to the radiation-sensitive material, and (3) developing the exposed layer of radiation-sensitive material to define a patterned mask layer. Various process operations, such as etching or ion implantation processes, may then be performed on the underlying layer of material or substrate through the patterned mask layer.

The design and manufacture of reticles used in such photolithography processes is a very complex and expensive undertaking as such masks must be very precise and must enable the repeated and accurate formation of a desired pattern in the underlying layer of material (for an etching process). It is well known that, for a variety of reasons, photolithography systems do not print features in a layer of photoresist that correspond exactly to the features depicted in a theoretical target exposure pattern, e.g., the lengths of line-type features may be shorter than anticipated, corners may be rounded instead of square, etc. There are several factors that cause such printing differences, such as interference between light beams transmitted through adjacent patterns, resist processes, the reflection of light from adjacent or underlying materials or structures, unacceptable variations in topography, etc. One technique used in designing and developing masks for use in semiconductor manufacturing to overcome or at least reduce such optical proximity errors involves the use of software-based optical proximity correction (OPC) techniques in an effort to make sure that a mask, when used, generates the desired pattern on the target material or structure in a reliable and repeatable manner.

In recent years, the accuracy of pattern transfer in photolithography processes has become even more important and more difficult due to, among other things, the ongoing shrinkage of various features on integrated circuit devices. Of course, the ultimate goal in integrated circuit fabrication is to faithfully reproduce the original circuit design on the integrated circuit product. Historically, the feature sizes and pitches (where the pitch is equal to the width of the feature plus the spacing between identical edge features) employed in integrated circuit products were such that a desired pattern could be formed using a single patterned photoresist masking layer. However, in recent years, device dimensions and pitches have been reduced to the point where existing photolithography tools, e.g., 193 nm wavelength photolithography tools, cannot perform a single exposure process to form a single patterned mask layer that will enable the formation of all of the desired features of the overall target pattern.

Accordingly, lithography engineers have resorted to various resolution enhancement techniques to form features on integrated circuit products. Such resolution enhancement techniques include, but are not limited to, so-called multiple-exposure (e.g., "double exposure") and multiple-patterning (e.g., "double patterning" or "triple patterning") techniques. It is understood that these general categories can be extended beyond two masks to include multiple exposures and multiple patterning; however, in the present application, only double exposure and double patterning will be referenced. In some double exposure processes, a single layer of photoresist material is subjected to two different exposures using two different reticles, and that single, twice-exposed layer of photoresist is then developed and processed to create the final patterned photoresist masking layer that will be used in performing a process operation, e.g., an etching process, to define features or structures of an integrated circuit product. Other variations in such a double exposure process are known to those skilled in the art. In a double patterning process, an intermediate transfer mask layer is formed above a layer that is to be patterned, e.g., a layer of gate electrode material. Thereafter, a first photoresist layer is exposed with a first mask, then developed, and the pattern in the first patterned photoresist mask layer is transferred to the underlying intermediate transfer mask layer by performing an etching process through the first patterned photoresist mask layer. Then, the first patterned photoresist mask layer is removed and a second layer of photoresist material is formed above the partially patterned intermediate transfer mask layer. The second photoresist layer is then exposed with a second mask, and then developed, and the pattern in the second patterned photoresist mask layer is transferred to the underlying intermediate transfer mask layer by performing an etching process through the second patterned photoresist mask layer. This results in the intermediate transfer mask layer having the pattern reflected by the combination of the first and second patterned photoresist mask layers. The second patterned photoresist mask is then removed, and the underlying layer to be patterned is thereafter patterned using the now fully patterned intermediate transfer mask layer. While such techniques effectively increase the complexity of the photolithography process, they do result in improving the achievable resolution and they enable the printing of far smaller features that would otherwise not be possible using existing photolithography tools and a single masking layer, single exposure, lithography process. There are many variations of double exposure and double patterning process operations and, as will be appreciated by one skilled in the art after a complete reading of the present application, many of those variations may benefit from the methodologies set forth in the present application. For clarity, in the subsequent discussion, no distinction will be made between double exposure and double patterning process operations, and, in all cases, these will simply be referred to as double patterning processes.

Despite all of these techniques, the lithography process that is exerted to a point at or near its limits will still not allow all patterns to be faithfully reproduced on the wafer in the presence of normal manufacturing process variations. As a result, some design target shapes must be modified to align with process capabilities. Such a so-called "retargeting" process often involves making isolated patterns larger, making patterns with small areas larger and/or smaller and expanding regions where patterns transition from one periodicity to another (i.e., so-called fan-out regions). In general, retargeting is done in an effort to make manufacturing easier and to get more process margins in regions where features sizes can be changed.

The photolithographic masks or reticles referred to above comprise geometric patterns corresponding to the circuit components that are part of an integrated circuit product. The patterns used to create such masks or reticles are generated utilizing computer-aided design (CAD) programs, wherein this process is sometimes referred to as electronic design automation. Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit.

FIGS. 1A-1E and FIG. 2 (flowchart form) depict one illustrative example of a prior art method of retargeting an overall target exposure pattern that is to be formed using double patterning processes. As shown in FIG. 1A, an initial overall target exposure pattern 10 is comprised of a plurality of features 12. For ease of reference, the features 12 have been labeled with additional numerical reference numbers 1-4. In the particular example depicted in FIG. 1A, the features 12 all have the same critical dimension (width), but the spacing between the features 2-3 is less than the spacing between the features 1-2 and 3-4. The space (or pitch) between the features 12 in the initial overall target pattern 10 is such that the initial overall target pattern 10 cannot be printed using a single mask with available photolithography tools. Thus, as shown in FIG. 1B and step 22 of FIG. 2, the initial overall target exposure pattern 10 is decomposed into a first exposure pattern 10A (comprised of the features 1 and 3) and a second exposure pattern 10B (comprised of the features 2 and 4). Shading has been added to the features 12 in the second exposure mask 10B for ease of explanation. At the point depicted in FIG. 1B, the decomposed first exposure pattern 10A and second exposure pattern 10B will be subject to various design rule checks (DRC) to make sure that the decomposed first and second exposure patterns 10A, 10B can each be patterned using a single layer of photoresist material without exceeding the capability of the photolithography tools and systems that will be used to manufacture an integrated circuit product.

As shown in FIG. 1C and step 24 of FIG. 2, after the first and second exposure patterns 10A, 10B have passed the various design rule checks, the first and second exposure patterns 10A, 10B will be recombined into a recombined overall target exposure pattern 10R.

With reference to FIG. 1D and step 26 of FIG. 2, the next process operation involves retargeting of the recombined overall target exposure pattern 10R. More specifically, using the recombined overall target exposure pattern 10R as the starting point, the width of the feature 1 in the first exposure pattern 10A is increased by an amount indicated by the arrow 14, while the width of the feature 4 in the second exposure pattern 10B is increased by an amount indicated by the arrow 16. As shown in FIG. 1D, this retargeting results in a retargeted, recombined overall pattern 10RT comprised of the original features 2, 3 and the retargeted (enlarged) features 1 and 4. As discussed above, such changes in the width of the features 1 and 4 may facilitate more accurate manufacturing. Of course, the changes in the width of the features 1 and 4 need not be the same.

Thereafter, as indicated in FIG. 1E and step 28 of FIG. 2, the retargeted, recombined overall target exposure pattern 10RT is decomposed into the first and second exposure patterns 10A, 10B. Then, as indicated at decision block 30 in FIG. 2, the decomposed first and second exposure patterns 10A, 10B are examined to determine if they are design rule compliant. If the decomposed first and second exposure patterns 10A, 10B are not design rule compliant (the "NO" branch), then the process restarts at step 22 in FIG. 2. Various changes may be made to any or all of the first and second exposure patterns 10A, 10B, as well as the overall target exposure pattern 10, until such time as the first and second exposure patterns 10A, 10B can pass the design rule check indicated at decision block 30 in FIG. 2.

Ultimately, when the mask design process is completed, data corresponding to the first and second exposure patterns 10A, 10B (modified as necessary during the design process) will be provided to a mask manufacturer that will produce a tangible mask (not shown) to be used in a photolithographic tool to manufacture integrated circuit products. More specifically, the various sub-wavelength resolution assist features (SRAF) may be added to one or both of the first and second exposure patterns 10A, 10B, optical proximity correction (OPC) and/or OPC verification analysis (OPCVA) may thereafter be performed on the first and second exposure patterns 10A, 10B, as indicated in blocks 32 and 36. The data corresponding to the first and second exposure patterns 10A, 10B may then be provided to the mask manufacturer, as indicated in blocks 34 and 38.

The present disclosure is directed to various methods that involve color-aware retargeting of individual decomposed patterns when designing masks or reticles to be used in multiple patterning processes, such as double patterning processes, and the use of such masks or reticles in various photolithography systems to manufacture integrated circuit products.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods that involve color-aware retargeting of individual decomposed patterns when designing masks or reticles to be used in multiple patterning processes, such as double patterning processes, and the use of such masks or reticles in various photolithography systems to manufacture integrated circuit products. One illustrative method disclosed herein includes the steps of decomposing an initial overall target exposure pattern into at least a first decomposed sub-target pattern and a second decomposed sub-target pattern, wherein each of the first and second decomposed sub-target patterns comprise at least one feature, performing a first retargeting process on the first decomposed sub-target pattern while using the second decomposed sub-target pattern as a reference layer during the first retargeting process so as to thereby define a retargeted first decomposed sub-target pattern, performing a second retargeting process on the second decomposed sub-target pattern while using the first decomposed sub-target pattern as a reference layer during the second retargeting process so as to thereby define a retargeted second decomposed sub-target pattern and, after performing the first and second retargeting processes, performing at least one process operation to determine if each of the retargeted first decomposed sub-target pattern and the retargeted second decomposed sub-target is in compliance with at least one design rule.

In another illustrative example, a method disclosed herein includes the steps of decomposing an initial overall target exposure pattern into at least a first decomposed sub-target pattern and a second decomposed sub-target pattern, wherein each of the first and second decomposed sub-target patterns comprise at least one feature, performing a first retargeting process on the first decomposed sub-target pattern while using the second decomposed sub-target pattern as a reference layer during the first retargeting process, wherein the first retargeting process results in a retargeted first decomposed sub-target pattern and includes adjusting a size of at least one feature of the first decomposed sub-target pattern, and performing a second retargeting process on the second decomposed sub-target pattern while using the first decomposed sub-target pattern as a reference layer during the second retargeting process, wherein the second retargeting process results in a retargeted second decomposed sub-target pattern and includes adjusting a size of at least one feature of the second decomposed sub-target pattern. In this embodiment, the method includes the additional steps of, after performing the first and second retargeting processes, performing at least one process operation to determine if each of the retargeted first decomposed sub-target pattern and the retargeted second decomposed sub-target is in compliance with at least one design rule and performing at least one optical proximity correction process on the retargeted first decomposed sub-target pattern and the retargeted second decomposed sub-target pattern.

BRIEF DESCRIPTION OF THE DRAWINGS

The disclosure may be understood by reference to the following description taken in conjunction with the accompanying drawings, in which like reference numerals identify like elements, and in which:

FIGS. 1A-1E and FIG. 2 depict one illustrative example of a prior art retargeting method that is used in developing reticles (or masks) for double patterning applications;

FIGS. 3A-3D and FIG. 4 depict various illustrative novel methods disclosed herein involving color-aware retargeting of individual decomposed patterns when designing masks or reticles to be used in in multiple patterning processes.

Figure 1E:
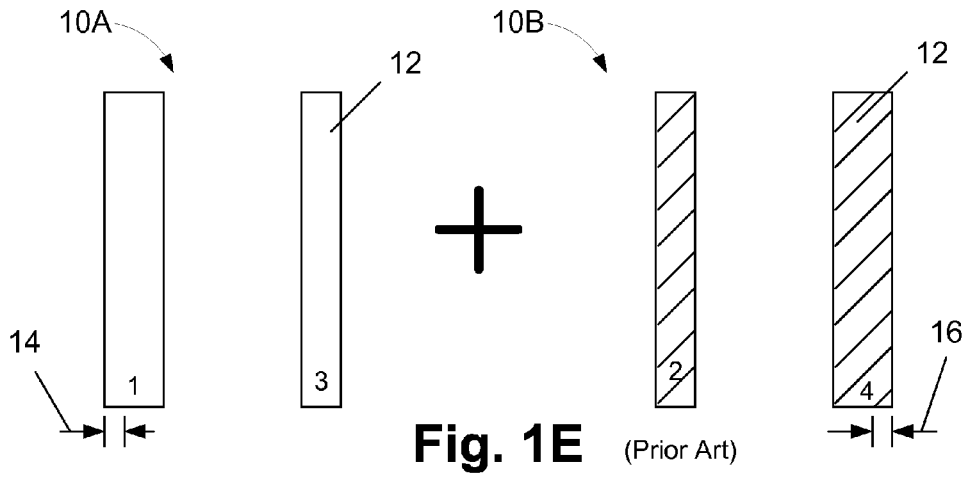
Figure 2:
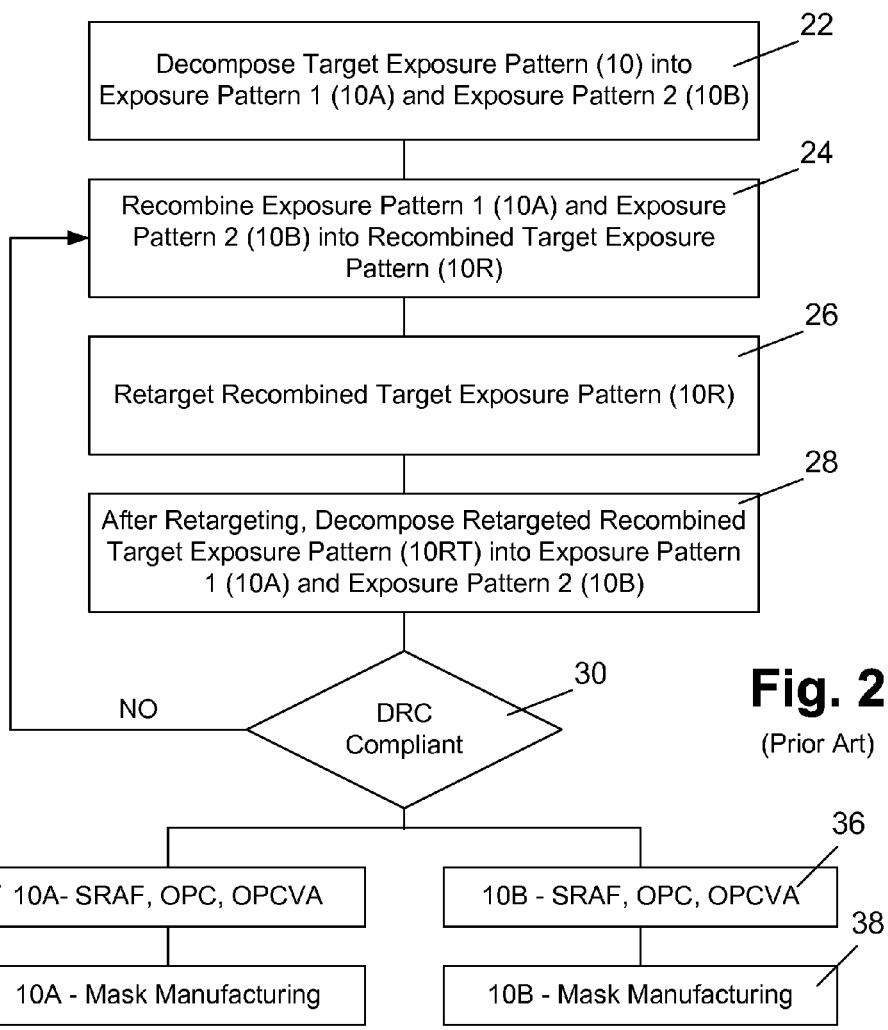

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods that involve color-aware retargeting of individual decomposed patterns when designing masks or reticles to be used in multiple patterning processes, such as double patterning processes, and the use of such masks or reticles in various photolithography systems to manufacture integrated circuit products. As will be readily apparent to those skilled in the art upon a complete reading of the present application, the methods disclosed herein may be employed in the fabrication of a variety of devices, such as logic devices, memory devices, ASICs, etc., and they may be employed to manufacture semiconductor devices as device dimensions continue to shrink. With reference to the attached figures, various illustrative embodiments of the methods disclosed herein will now be described in more detail.

Figure 3A:
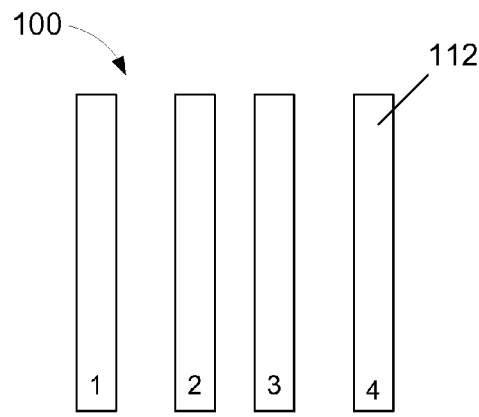

FIGS. 3A-3D and FIG. 4 (flowchart form) depict various illustrative novel methods disclosed herein that involve color-aware retargeting of individual decomposed patterns when designing masks or reticles to be used in in multiple patterning processes. As shown in FIG. 3A, an initial overall target exposure pattern 100 is comprised of a plurality of features 112. For ease of reference, the features 112 have been labeled with additional numerical reference numbers 1-4. In the particular example depicted in FIG. 3A, the features 112 all have the same critical dimension (width), but the spacing between the features 2-3 is less than the spacing between the features 1-2 and 3-4. The space (or pitch) between the features 112 in the initial overall target exposure pattern 100 is such that the initial overall target exposure pattern 100 cannot be printed using a single mask, single exposure process with available photolithography tools.

Figure 3B:
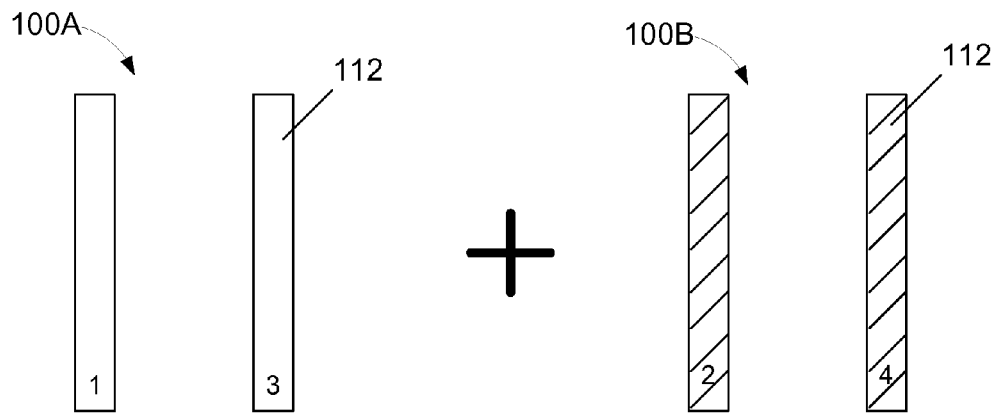

As shown in FIG. 3B and step 130 of FIG. 4, an initial step in the illustrative embodiments of the methods disclosed herein involves decomposing the initial overall target exposure pattern 100 into a first decomposed sub-target pattern 100A (comprised of the features 1 and 3) and a second decomposed sub-target pattern 100B (comprised of the features 2 and 4). Shading has been added to the features 112 in the second decomposed sub-target pattern 100B for ease of explanation. At the point depicted in FIG. 3B, the first decomposed sub-target pattern 100A and second decomposed sub-target pattern 100B may be subject to various design rule checks (DRC) to make sure that the first and second decomposed sub-target patterns 100A, 100B can each be patterned using a single layer of photo-resist material without exceeding the capability of the photolithography tools and systems that will be used to manufacture an integrated circuit product. Of course, the DRC checking may be performed before and/or after the retargeting process.

Figures 3C, 3D:
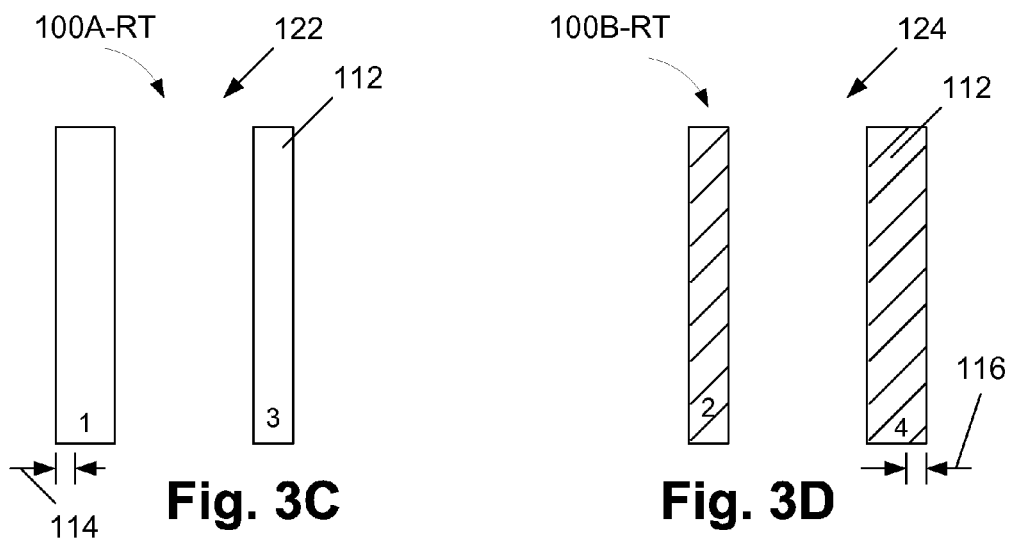

Next, unlike the prior art method discussed in the background section of this application, and as shown in FIG. 3C-3D and steps 132 and 134 of FIG. 4, retargeting process operations are performed individually on the first decomposed sub-target pattern 100A and the second decomposed sub-target pattern 100B, i.e., the retargeting is performed on the decomposed sub-target patterns 100A, 100B.

For example, with reference to FIG. 3C and step 132 of FIG. 4, a first retargeting process operation 122 is performed only on the first decomposed sub-target pattern 100A so as to thereby result in a retargeted first decomposed sub-target pattern 100A-RT. In the depicted example, performing the first retargeting process operation 122 results in the width of the feature 1 in the first decomposed sub-target pattern 100A being increased by an amount indicated by the arrow 114, while the width of the feature 3 in the first decomposed sub-target pattern 100A remains unchanged. Of course, performing the first retargeting process operation 122 need not necessarily result in the changing of the size of any feature 112 in the first decomposed sub-target pattern 100A, although such changes in features size frequently occur during a retargeting process. In one illustrative embodiment, the second decomposed sub-target pattern 100B is used as a reference layer during the first retargeting process operation 122 that is performed on the first decomposed sub-target pattern 100A. That is, when performing the first retargeting process operation 122, the retargeting software is aware of the position and location of the features 112 on the second decomposed sub-target pattern 100B relative to the features 112 on the first decomposed sub-target pattern 100A that are being retargeted.

Similarly, with reference to FIG. 3D and step 134 of FIG. 4, a second retargeting process operation 124 is performed only on the second decomposed sub-target pattern 100B so as to thereby result in a retargeted second decomposed sub-target pattern 100B-RT. In the depicted example, performing the second retargeting process operation 124 results in the width of the feature 4 in the second decomposed sub-target pattern 100B being increased by an amount indicated by the arrow 116, while the width of the feature 2 in the second decomposed sub-target pattern 100B remains unchanged. As before, performing the second retargeting process operation 124 need not necessarily result in the changing of the size of any feature 112 in the second decomposed sub-target pattern 100B, although such changes in features size frequently occur during a retargeting process. Importantly, although the terms "first" and "second" are used to describe the retargeting process operations 122, 124, the use of such terminology is for reference purposes only and should not be understood to mean the process 122 is always performed before the process 124. In fact, the first retargeting process operation 122 and the second retargeting process operation 124 may be performed in any desired order. In one illustrative embodiment, the first decomposed sub-target pattern 100A is used as a reference layer during the second retargeting process operation 124 that is performed on the second decomposed sub-target pattern 100B. That is, when performing the second retargeting process operation 124, the retargeting software is aware of the position and location of the features 112 on the first retargeting process operation 122 relative to the features 112 on the second decomposed sub-target pattern 100B that are being retargeted.

With reference to decision block 136 in FIG. 4, each of the retargeted first decomposed sub-target pattern 100A-RT and the retargeted second decomposed sub-target pattern 100B-RT are individually checked to determine if they are design rule compliant. If either of the retargeted first decomposed sub-target pattern 100A-RT or the retargeted second decomposed sub-target pattern 100B-RT are determined to not be design rule compliant (the "NO" branch), then the process restarts at step 130 in FIG. 4, wherein the overall target exposure pattern 100 would be decomposed into first and second sub-target patterns 100A, 100B and the process described herein would be repeated. Various changes may be made to any or all of the features on the first decomposed sub-target pattern 100A and/or the second decomposed sub-target pattern 100B, until such time as the retargeted first decomposed sub-target pattern 100A-RT and the retargeted second decomposed sub-target pattern 100B-RT can both pass the design rule checking indicated at decision block 136 in FIG. 4.

Once design rule checking is completed, additional OPC operations may be performed on the retargeted first decomposed sub-target pattern 100A-RT and the retargeted second decomposed sub-target pattern 100B-RT, as indicated in blocks 140, 142, respectively, of FIG. 4. For example, various sub-wavelength resolution assist features (SRAF) may be added to one or both of the first and second retargeted decomposed sub-target patterns 100A-RT, 100B-RT, optical proximity correction (OPC) and/or OPC verification analysis (OPCVA) may thereafter be performed on the first and second retargeted decomposed sub-target patterns 100A-RT, 100B-RT, as indicated in blocks 140 and 142, respectively. The data corresponding to the first and second retargeted decomposed sub-target patterns 100A-RT, 100B-RT may then be provided to the mask manufacturer, as indicated in blocks 144 and 146, respectively. Ultimately, the mask manufacturer will produce a tangible mask (not shown) corresponding to each of the retargeted first decomposed sub-target pattern 100A-RT and the retargeted second decomposed sub-target pattern 100B-RT to be used in a photolithographic tool to manufacture integrated circuit products.

To the extent such modifications are required, the configuration of the first and second retargeted decomposed sub-target patterns 100A-RT, 100B-RT may be modified in accordance with standard OPC techniques, e.g., line length may be increased (such a modified pattern is not depicted herein). This OPC process (an iterative process) may be repeated as often as necessary until a final mask shape for the retargeted first decomposed sub-target pattern 100A-RT is developed that will produce an acceptable transfer of the initial overall target exposure pattern 100. In general, any type of OPC method may be employed with the inventions disclosed herein, e.g., rules-based approaches, simulation-based approaches, or combinations thereof. Thus, the particular type of OPC process performed on the first and second retargeted decomposed sub-target patterns 100A-RT, 100B-RT, or any other patterns discussed herein, should not be considered to be a limitation of the present invention.

Figure 5:
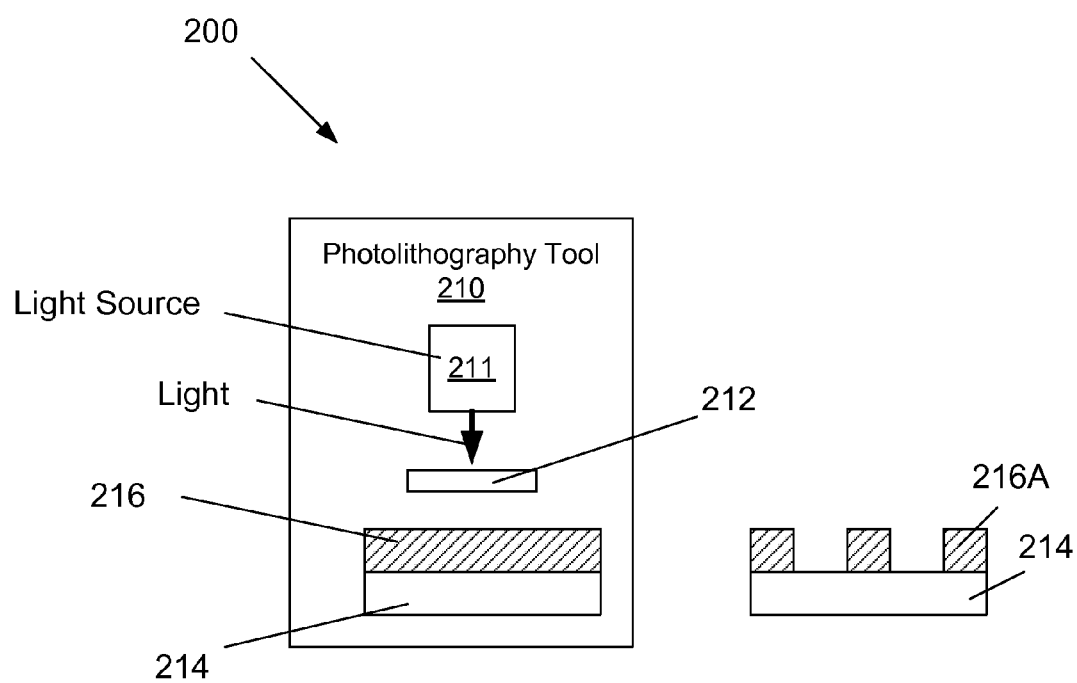
FIG. 5 schematically depicts an illustrative system disclosed herein for exposing a plurality of substrates using the reticles designed as disclosed herein.

FIG. 5 schematically depicts an illustrative system 200 comprised of a photolithography tool 210 (having a light source 211), a reticle 212, an illustrative substrate or wafer 214 and a layer of radiation-sensitive material, e.g., photoresist 216, formed above the wafer 214. At least portions of the data to be used in manufacturing the reticle 212 may be generated based on the various methods described above. The data may then be provided to a manufacturer to manufacture the reticle 212. The reticle 212 may then be employed in the photolithography tool 210 (which may be of any desired configuration and employ any desired wavelength or form of radiation) by an integrated circuit device manufacturer to expose the layer of photoresist 216 in the photolithography tool 210 such that the pattern in the reticle 212 may be transferred to the layer of photoresist 216. Thereafter the exposed layer of photoresist may then be developed using traditional processes to thereby define a patterned layer of photoresist 216A that may be used in fabricating or defining various portions or regions of an integrated circuit product that will be formed on the substrate 214. The reticle 212 may be used to form patterned layers of photoresist above additional wafers as processing continues.

As will be recognized by those skilled in the art after a complete reading of the present application, the various methods and actions described herein may be performed by software programs operating on some form of computing device, e.g., a personal computer, a workstation, a mainframe computer, etc. The manner in which such software programs may be written so as to implement the methods disclosed herein are well known to those skilled in the art.

Unlike the prior art methods described in the background section of this application, using the novel methods disclosed herein, the retargeting processes performed on one of the decomposed sub-target patterns is performed while using the other of the decomposed sub-target patterns as a reference layer. The methods disclosed herein provide a significant advantage as it relates to the prior art methods in that the cumbersome and often difficult process of trying to re-decompose retargeted sub-target patterns is avoided, thereby reducing costs and improving manufacturing efficiencies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
    decomposing an initial overall target exposure pattern into at least a first decomposed sub-target pattern and a second decomposed sub-target pattern, wherein each of said first and second decomposed sub-target patterns comprise at least one feature;
    performing a first retargeting process on said first decomposed sub-target pattern to thereby define a retargeted first decomposed sub-target pattern while using said second decomposed sub-target pattern as a reference layer during said first retargeting process;
    performing a second retargeting process on said second decomposed sub-target pattern to thereby define a retargeted second decomposed sub-target pattern while using said first decomposed sub-target pattern as a reference layer during said second retargeting process; and
    after performing said first and second retargeting processes, performing at least one process operation to determine if each of said retargeted first decomposed sub-target pattern and said retargeted second decomposed sub-target is in compliance with at least one design rule.

2. The method of claim 1, wherein said first retargeting process is performed before said second retargeting process.

3. The method of claim 1, wherein said second retargeting process is performed before said first retargeting process.

4. The method of claim 1, wherein performing said first retargeting process on said first decomposed sub-target pattern includes adjusting a size of at least one feature of said first decomposed sub-target pattern.

5. The method of claim 1, wherein performing said second retargeting process on said second decomposed sub-target pattern includes adjusting a size of at least one feature of said second decomposed sub-target pattern.

6. The method of claim 1, further comprising:
    manufacturing a first reticle based upon said retargeted first decomposed sub-target pattern; and
    manufacturing a second reticle based upon said retargeted second decomposed sub-target pattern.

7. The method of claim 6, further comprising positioning said first reticle in a photolithography tool and exposing a light sensitive layer of material formed above a substrate to light based upon a pattern defined in said first reticle.

8. The method of claim 7, further comprising positioning said second reticle in said photolithography tool and exposing said light sensitive layer of material formed above said substrate to light based upon a pattern defined in said second reticle.

9. A method, comprising:
    decomposing an initial overall target exposure pattern into at least a first decomposed sub-target pattern and a second decomposed sub-target pattern, wherein each of said first and second decomposed sub-target patterns comprise at least one feature;
    performing a first retargeting process on said first decomposed sub-target pattern while using said second decomposed sub-target pattern as a reference layer during said first retargeting process, wherein said first retargeting process results in a retargeted first decomposed sub-target pattern and includes adjusting a size of at least one feature of said first decomposed sub-target pattern;
    performing a second retargeting process on said second decomposed sub-target pattern while using said first decomposed sub-target pattern as a reference layer during said second retargeting process, wherein said second retargeting process results in a retargeted second decomposed sub-target pattern and includes adjusting a size of at least one feature of said second decomposed sub-target pattern; and
    after performing said first and second retargeting processes, performing at least one process operation to determine if each of said retargeted first decomposed sub-target pattern and said retargeted second decomposed sub-target pattern is in compliance with at least one design rule.

10. The method of claim 9, wherein said first retargeting process is performed before said second retargeting process.

11. The method of claim 9, wherein said second retargeting process is performed before said first retargeting process.

12. The method of claim 9, wherein, after performing said at least one optical proximity correction process, the method further comprises:
   manufacturing a first reticle based upon said retargeted first decomposed sub-target pattern; and
   manufacturing a second reticle based upon said retargeted second decomposed sub-target pattern.

13. The method of claim 12, further comprising positioning said first reticle in a photolithography tool and exposing a light sensitive layer of material formed above a substrate to light based upon a pattern defined in said first reticle.

14. The method of claim 13, further comprising positioning said second reticle in said photolithography tool and exposing said light sensitive layer of material formed above said substrate to light based upon a pattern defined in said second reticle.

\* \* \* \* \*